United States Patent
Lin

(10) Patent No.: US 8,076,735 B2
(45) Date of Patent: Dec. 13, 2011

(54) SEMICONDUCTOR DEVICE WITH TRENCH OF VARIOUS WIDTHS

(75) Inventor: Chun-Hsien Lin, Tainan County (TW)

(73) Assignee: United Microelectronics Corp., Hsinchu (TW)

(*) Notice: Subject to any disclaimer, the term of this patent is extended or adjusted under 35 U.S.C. 154(b) by 211 days.

(21) Appl. No.: 12/572,498

(22) Filed: Oct. 2, 2009

(65) Prior Publication Data
US 2011/0079854 A1    Apr. 7, 2011

(51) Int. Cl.
H01L 29/76 (2006.01)
H01L 29/94 (2006.01)
H01L 31/062 (2006.01)
H01L 31/113 (2006.01)
H01L 31/119 (2006.01)
H01L 27/108 (2006.01)

(52) U.S. Cl. .......... 257/407; 257/310; 257/E29.15; 257/E29.16

(58) Field of Classification Search .......... 257/310, 257/407, E29.15, E29.16
See application file for complete search history.

(56) References Cited

U.S. PATENT DOCUMENTS

| | | | |
|---|---|---|---|
| 5,685,950 A * | 11/1997 | Sato | 438/713 |
| 5,834,816 A * | 11/1998 | Jang | 257/382 |
| 5,840,611 A * | 11/1998 | Lee et al. | 438/307 |
| 5,879,975 A * | 3/1999 | Karlsson et al. | 438/162 |
| 6,060,375 A * | 5/2000 | Owyang et al. | 438/585 |
| 6,661,066 B2 * | 12/2003 | Kuroi et al. | 257/412 |
| 6,674,137 B2 * | 1/2004 | Nissa | 257/408 |
| 7,208,361 B2 | 4/2007 | Shah et al. | |
| 7,749,911 B2 * | 7/2010 | Wu et al. | 438/701 |
| 7,939,895 B2 * | 5/2011 | Fukasaku | 257/369 |
| 2007/0126067 A1 * | 6/2007 | Hattendorf et al. | 257/412 |
| 2009/0189219 A1 * | 7/2009 | Shinbori et al. | 257/334 |
| 2009/0218603 A1 * | 9/2009 | Brask et al. | 257/255 |
| 2011/0070702 A1 * | 3/2011 | Chien et al. | 438/211 |

FOREIGN PATENT DOCUMENTS

JP    08055863 A    *    2/1996

OTHER PUBLICATIONS

H. Seidel et al., "Anisotropic Etching of Crystalline Silicon in Alkaline Solutions: I. Orientation Dependence and Behavior of Passivation Layers" Journal of the Electrochemical Society, vol. 37, No. 11, Nov. 1990, pp. 3612-3626.
H. Seidel et al., "Anisotropic Etching of Crystalline Silicon in Alkaline Solutions: II. Influence of Dopants" Journal of the Electrochemical Society, vol. 37, No. 11, Nov. 1990, pp. 3626-3632.

* cited by examiner

Primary Examiner — Ida M Soward
(74) Attorney, Agent, or Firm — WPAT, PC; Justin King

(57) ABSTRACT

A semiconductor device and a method for fabricating the same are described. A polysilicon layer is formed on a substrate. The polysilicon layer is doped with an N-type dopant. A portion of the polysilicon layer is then removed to form a plurality of dummy patterns. Each dummy pattern has a top, a bottom, and a neck arranged between the top and the bottom, where the width of the neck is narrower than that of the top. A dielectric layer is formed on the substrate to cover the substrate disposed between adjacent dummy patterns, and the top of each dummy pattern is exposed. Thereafter, the dummy patterns are removed to form a plurality of trenches in the dielectric layer. A plurality of gate structures is formed in the trenches, respectively.

6 Claims, 8 Drawing Sheets

SEMICONDUCTOR DEVICE WITH TRENCH OF VARIOUS WIDTHS

BACKGROUND OF THE INVENTION

1. Field of the Invention

The invention relates to a semiconductor device and a method of fabricating the same. More particularly, the invention relates to a void-free semiconductor device and a method of fabricating the same.

2. Description of Related Art

With the continual miniaturization of semiconductor devices, dimensions of gate structures are also gradually reduced. Therefore, the thickness of gate dielectric layers also needs to be reduced to prevent the performance of the devices from being affected. Generally, the material of the gate dielectric layers usually includes silicon oxide. However, the leakage current phenomenon frequently occurs when reducing the thickness of the gate dielectric layers adopting silicon oxide. In order to reduce the occurrence of leakage current, a conventional method is to replace silicon oxide with high dielectric constant (high-k) material for the gate dielectric layers. When applying high dielectric constant material in the gate dielectric layers, the gates adopting polysilicon then react with high dielectric constant material to generate Fermi-level pinning, thereby resulting in an increase in the threshold voltage so as to affect device performance. In one of the conventional techniques, the metal layer is applied as the gate, that is, the work function metal layer known in the art, to prevent the threshold voltage from increasing and therefore reducing the resistance of the device.

In a conventional gate structure composed of a high dielectric constant dielectric layer and a metal gate, the dummy patterns are first formed and then the gate structures are formed in the current method. In other words, the dummy patterns and the interlayer dielectric layer are first formed on the substrate. Next, the dummy patterns are removed, and then the metal gate structures are formed in the openings that are formed after the removal of the dummy patterns.

However, in the process of patterning the dummy pattern material layer to form the dummy patterns, due to the constraints of the etching process, the resultant dummy patterns are usually shaped into trapezoids having a narrow top and a wide bottom, so that an included angle between the top sidewall of each the dummy pattern and the surface of the interlayer dielectric layer is about 88°-89°. Since the trapezoid dummy patterns have a narrow top and a wide bottom, an opening with a narrower top portion is formed after the dummy patterns are removed. Hence, when the opening is filled with the metal layer by a sputtering process, the effect of metal gap fill is poor, so that problems such as overhang and the like usually occur to cause the formation of voids in the metal layer, thereby affecting the reliability and performance of the device.

SUMMARY OF THE INVENTION

Accordingly, the invention provides a method of fabricating a semiconductor device to carry out an ion implantation process before dummy patterns are formed, so as to enhance the reliability and performance of the device.

The invention provides a semiconductor device, in which a gate structure thereof is disposed in a trench having a wider opening in a top, and the semiconductor device therefore includes a void-free metal layer.

The invention provides a method of fabricating a semiconductor device. Firstly, a polysilicon layer is formed on a substrate. An N-type dopant is doped into the polysilicon layer. Next, a portion of the polysilicon layer is removed to form a plurality of dummy patterns. Each dummy pattern includes a top, a bottom, and a neck arranged between the top and the bottom. Here, the width of the neck is narrower than that of the top. Thereafter, a dielectric layer is formed on the substrate. The dielectric layer covers the substrate between adjacent dummy patterns and exposes the top of each dummy pattern. Subsequently, the dummy patterns are removed to form a plurality of trenches in the dielectric layer. Afterwards, a plurality of gate structures is formed in the trenches respectively.

According to an embodiment of the invention, the depth of the polysilicon layer doped with the highest concentration of the N-type dopant and the neck are substantially located on the same horizontal level of height.

According to an embodiment of the invention, the concentration of the N-type dopant doped in the bottom of the polysilicon layer is greater than the concentration of the N-type dopant doped in the top of the same.

According to an embodiment of the invention, the concentration of the N-type dopant doped increases gradually from the top to the bottom of the polysilicon layer.

According to an embodiment of the invention, the method of fabricating the semiconductor device further includes a step of doping another N-type dopant into the polysilicon layer.

According to an embodiment of the invention, the N-type dopant is phosphorus (P), antimony (Sb), or arsenic (As).

According to an embodiment of the invention, when the N-type dopant is phosphorus, the energy for doping is greater than 1 Key but less than 20 KeV and the dose therefor is greater than $1E15$ cm$^{-2}$ but less than $8E15$ cm$^{-2}$.

According to an embodiment of the invention, the top and the neck have a first height therebetween, the neck and the bottom have a second height therebetween, and the ratio of the first height to the second height is substantially 2:1.

According to an embodiment of the invention, an included angle between the sidewall of the top of each trench and the surface of the dielectric layer is larger than 90°.

According to an embodiment of the invention, the method of removing a portion of the polysilicon layer further includes an etching process using a halogen-containing reactant.

According to an embodiment of the invention, before the dummy patterns are removed, a high dielectric constant layer is further formed between the substrate and each of the dummy patterns.

According to an embodiment of the invention, the method of fabricating the semiconductor device further includes a step of forming a source/drain region in the substrate at respective sides of the gate structure. The method of forming the source/drain region, for example, includes performing an ion implantation process or a selective epitaxy growth (SEG) process.

According to an embodiment of the invention, after the dummy patterns are formed and before the dielectric layer is formed, a spacer is further formed on the sidewall of each dummy pattern.

The invention further provides a semiconductor device including a substrate, a gate structure, and a source/drain region. A dielectric layer is formed on the substrate, and a trench is disposed in the dielectric layer. The gate structure is located in the trench and includes a high dielectric constant layer, a work function metal layer, and a metal layer sequentially disposed on the substrate. The source/drain region is disposed in the substrate at the respective sides of the gate structure. The trench includes a top, a bottom, and a neck arranged between the top and the bottom. The width of the neck is narrower than that of the top, and the width of the neck is narrower than or equal to that of the bottom.

According to an embodiment of the invention, the top and the neck have a first height therebetween, the neck and the bottom have a second height therebetween, and the ratio of the first height to the second height is substantially 2:1.

According to an embodiment of the invention, an included angle between the sidewall of the top of each trench and the surface of the dielectric layer is larger than 90°.

According to an embodiment of the invention, the semiconductor device further includes an insulation layer disposed between the substrate and the high dielectric constant layer.

According to an embodiment of the invention, the source/drain region is a doped region or an epitaxial layer.

According to an embodiment of the invention, the semiconductor device further includes a spacer disposed on the sidewall of the gate structure.

In light of the foregoing, in the method of fabricating the semiconductor device of the invention, the ion implantation process is performed after the polysilicon layer is formed. Thus, when removing a portion of the polysilicon layer, different etching rates at different depth locations of the doped polysilicon layer are utilized to form the dummy patterns having the width of the neck narrower than the width of the top. Hence, when removing the dummy patterns and filling the metal layer, not only are the dummy patterns removed rapidly, but the effect of metal gap fill is also improved, such that voids do not form easily, thereby greatly enhancing the reliability and performance of the device.

The gate structure of the semiconductor device in the invention is disposed in the trench having a wide opening in the top portion. Therefore, the metal layer of the gate structure does not include voids and can have superior device performance.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1E are cross-sectional views schematically illustrating a process for fabricating a semiconductor device according to an embodiment of the invention. It should be noted that the method of fabricating the semiconductor device described in the following adopts a gate last process to form a complementary metal oxide semiconductor (CMOS) device for illustration. People skilled in the art should be able to embody the invention based on the illustration, whereas the scope of the invention is not limited thereto. The formation of a single metal oxide semiconductor (MOS) device may also be implemented. Moreover, the disposition locations, the manners and the sequence of formation of other components such as metal gate structures, doped regions, spacers, stop layers, and the like are all fabricated with techniques known to people skilled in the art based on conventional arts, and are not limited to the descriptions illustrated in the following embodiments.

Figure 1A:
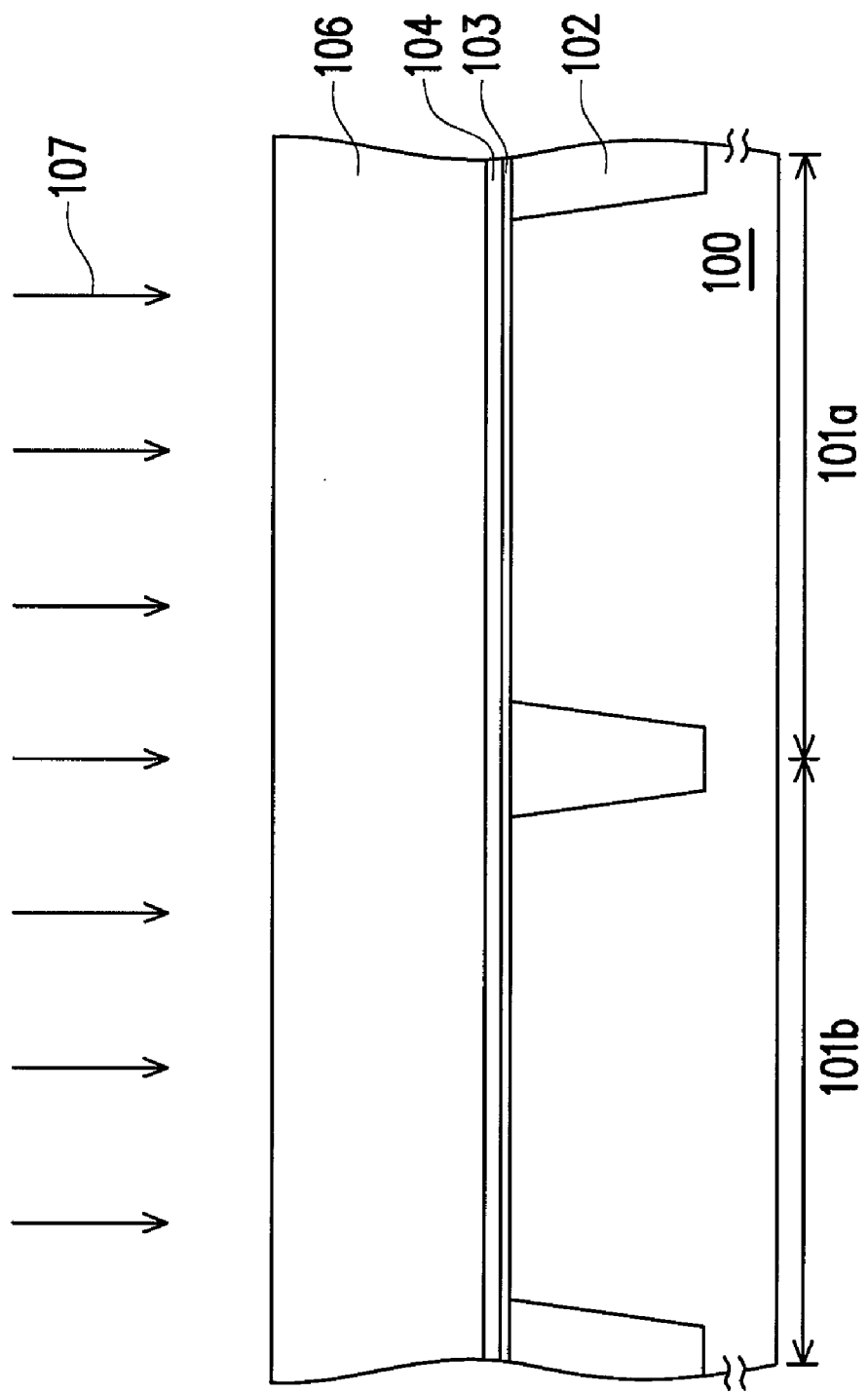
FIGS. 1A through 1E are cross-sectional views schematically illustrating a process for fabricating a semiconductor device according to an embodiment of the invention.

Referring to FIG. 1A, a substrate 100 is provided. The substrate 100, for example, is a semiconductor substrate such as an N-type or a P-type silicon substrate, group III-V semiconductor substrate, and the like. The substrate 100 includes a first region 101a and a second region 101b. The first region 101a and the second region 101b are spaced by isolation structures 102. In one embodiment, when the first region 101a is a P-type metal oxide semiconductor (PMOS) region, the second region 101b is an N-type metal oxide semiconductor (NMOS) region. The isolation structures 102 are shallow trench isolation structures, for example.

Next, a high dielectric constant (high-k) material layer 104 and a polysilicon layer 106 are sequentially formed on the substrate 100. The material of the high dielectric constant material layer 104 is, for example, a dielectric material with a dielectric constant greater than 4, such as $TiO_2$, $HfO_2$, $ZrO_2$, $Al_2O_3$, $La_2O_3$, $Y_2O_3$, $Gd_2O_3$, $Ta_2O_5$, or a combination thereof. The high dielectric constant material layer 104 is fabricated by a chemical vapor deposition (CVD) process, for instance. In one embodiment, before the high dielectric constant material layer 104 is formed, an insulation material layer 103 is also optionally formed on a surface of the substrate 100 to enhance an adhesion between the high dielectric constant material layer 104 and the substrate 100. The insulation material layer 103 is made of, for example, silicon oxide and formed, for example, in a thermal oxidizing process. The polysilicon layer 106 can be used as a material layer of dummy patterns to be formed subsequently, and is formed in a CVD process, for instance.

Afterwards, an ion implantation process 107 is performed to dope an N-type dopant into the polysilicon layer 106. In the ion implantation process 107, a blanket doping process is performed to the polysilicon layer 106 using a vertical ion implantation manner, for example. The N-type dopant, for example, is phosphorus (P), antimony (Sb), or arsenic (As). A concentration of the N-type dopant distributed in the polysilicon layer 106 varies with different depth locations in the polysilicon layer 106. For instance, the depth with the highest concentration of the doped N-type dopant is between the top and the bottom of the polysilicon layer 106. Alternatively, the concentration of the doped N-type dopant gradually increases from the top to the bottom of the polysilicon layer 106. In one embodiment, when the thickness of the polysilicon layer 106 is about 500 Å to 600 Å and the N-type dopant implanted is phosphorus, an appropriate energy within a range of 1 Kev to 20 KeV and a dose within a range of 1E15 to 8E15 $cm^{-2}$ are utilized in the ion implantation process 107. As a consequence, the location with the highest concentration of the N-type dopant is at a depth of about 300 Å to 400 Å away from the surface of the polysilicon layer 106.

Figure 1B:
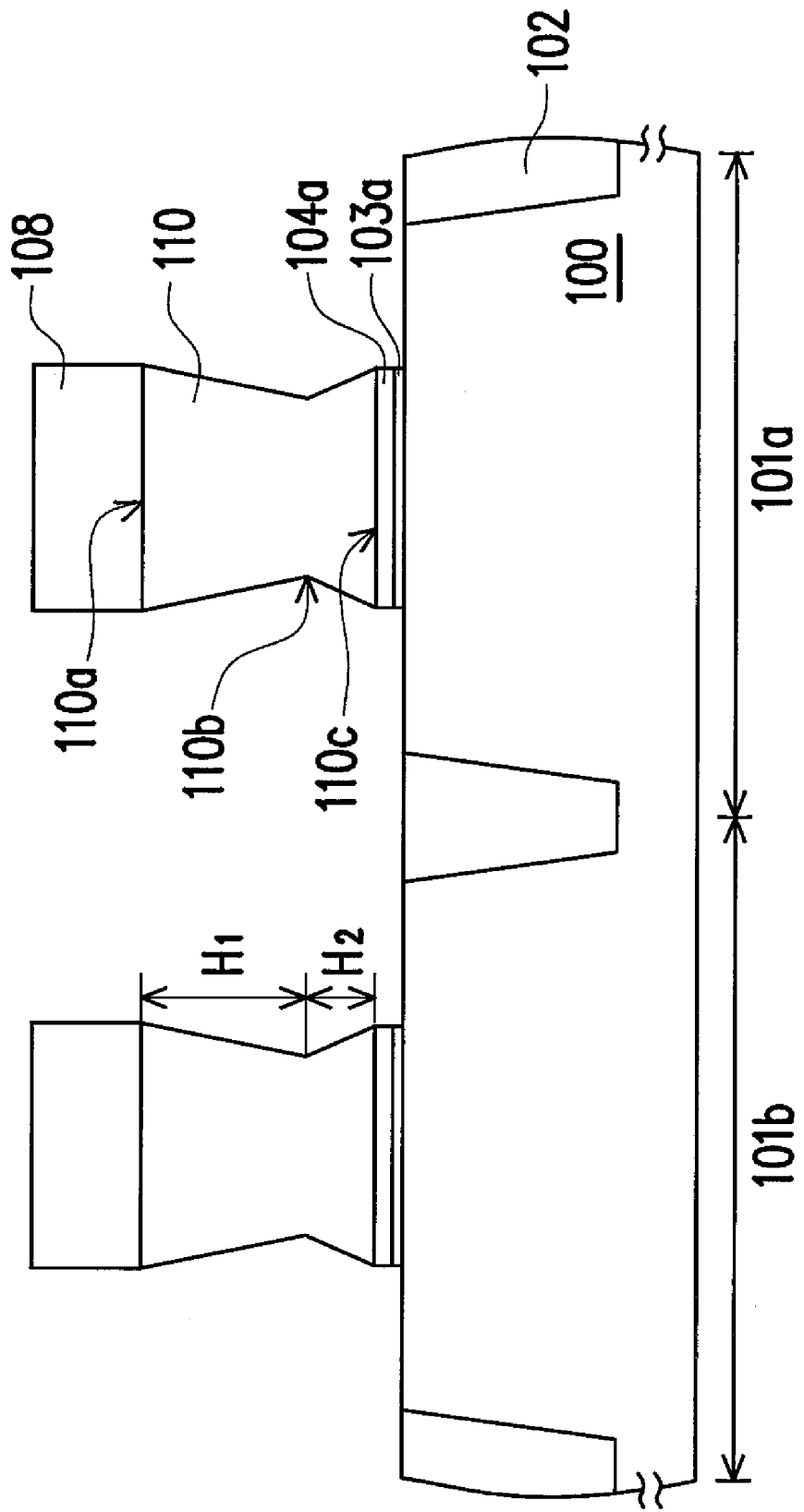

Referring to FIG. 1B, a patterned hard mask layer 108 is formed on the polysilicon layer 106. The patterned hard mask layer 108, for example, has openings to expose a portion of the surface of the polysilicon layer 106. In this step, the disposition of the openings of the patterned hard mask layer 108 is designed according to locations of gate structures to be formed subsequently. That is, the locations of the polysilicon layer 106 covered by the patterned hard mask layer 108 are the locations of the gate structures subsequently formed. The material of the patterned hard mask layer 108 is selected from materials having etching selectivity different from that of the polysilicon layer 106. Here, the material is silicon nitride, silicon oxide, or silicon oxynitride, for example. In a formation of the patterned hard mask layer 108, a layer of hard mask material layer (not shown) is first formed on the substrate 100 using the CVD process, for example. Thereafter, a photolithographic process and an etching process are sequentially performed by adopting a photoresist material to remove a portion of the hard mask material layer.

Subsequently, the patterned hard mask layer 108 is used as a mask to remove the exposed polysilicon layer 106, so as to form a plurality of dummy patterns 110. Afterwards, the high dielectric constant material layer 104 and the insulation material layer 103 are patterned to form the high dielectric constant layer 104a and the insulation layer 103a. Here, the high dielectric constant layer 104a and the insulation layer 103a are adopted jointly as a gate dielectric layer of the gate structure to be subsequently formed. Each dummy pattern 110 includes a top 110a, a neck 110b, and a bottom 110c. The neck 110b is arranged between the top 110a and the bottom 110c. The width of the neck 110b is narrower than that of the top 110a, and the width of the neck 110b is narrower than that of the bottom 110c, for example. Therefore, a cross-section with a funnel-like shape is formed. In one embodiment, when the top 110a and the neck 110b have a first height $H_1$ therebetween, and the neck 110b and the bottom 110c have a second height $H_2$ therebetween, the ratio of the first height $H_1$ to the second height $H_2$ is substantially 2:1. In a method of removing a portion of the polysilicon layer 106 to form the dummy patterns 110, a halogen-containing reactant is used for etching. A plasma gas source adopted in dry etching to remove a portion of the polysilicon layer 106 contains fluorine radicals, chlorine radicals, or bromine radicals, for instance.

It should be noted that the etching rate of the polysilicon layer 106 doped with the N-type dopant is higher than the etching rate of the undoped polysilicon material, and the etching rate increases as the concentration of the N-type dopant enhances. Therefore, the depth of the polysilicon layer 106 doped with the highest concentration of the N-type dopant and the neck 110b are substantially located on the same horizontal level of height as illustrated in FIG. 1B.

Figure 2:
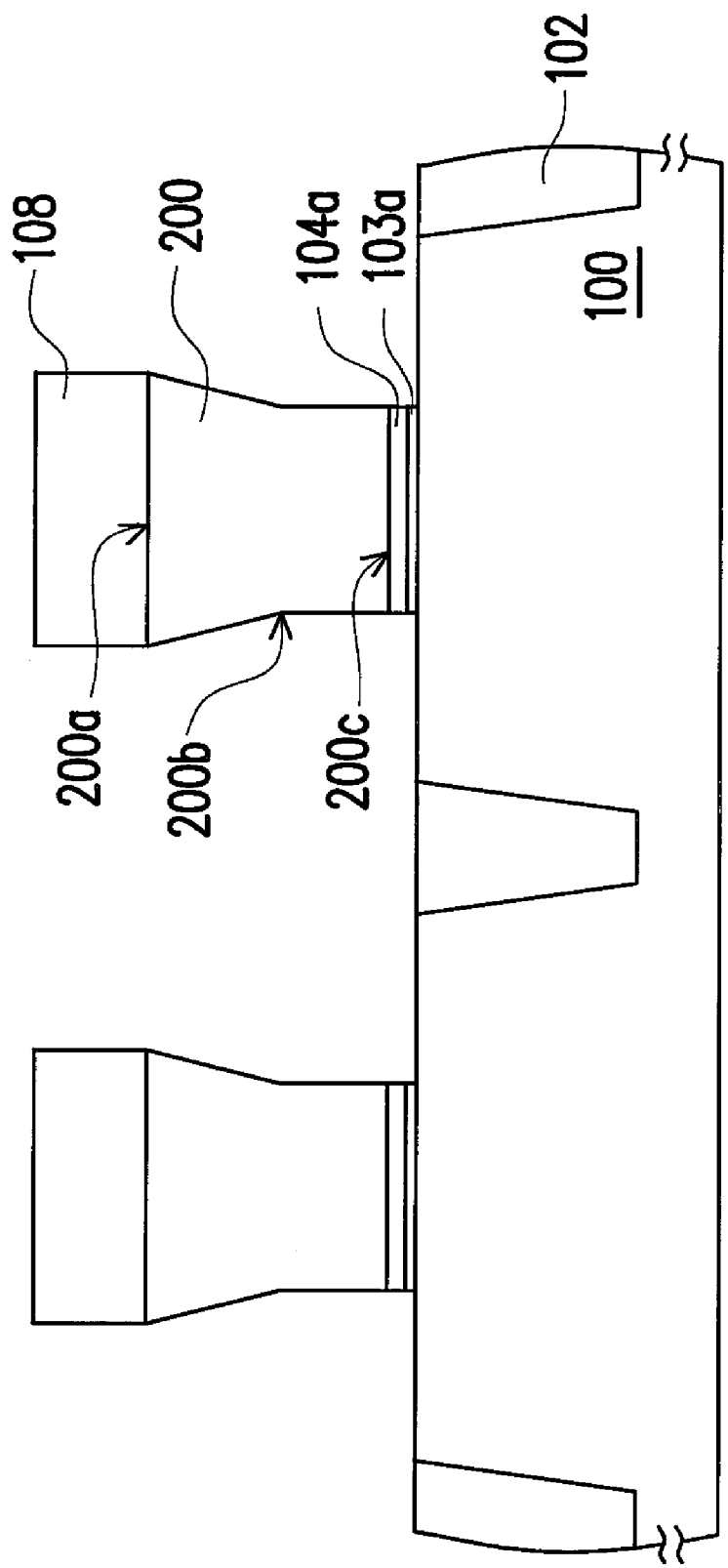
FIG. 2 and FIG. 3 respectively illustrate schematic cross-sectional views of dummy patterns according to another embodiment of the invention.
Figure 3:
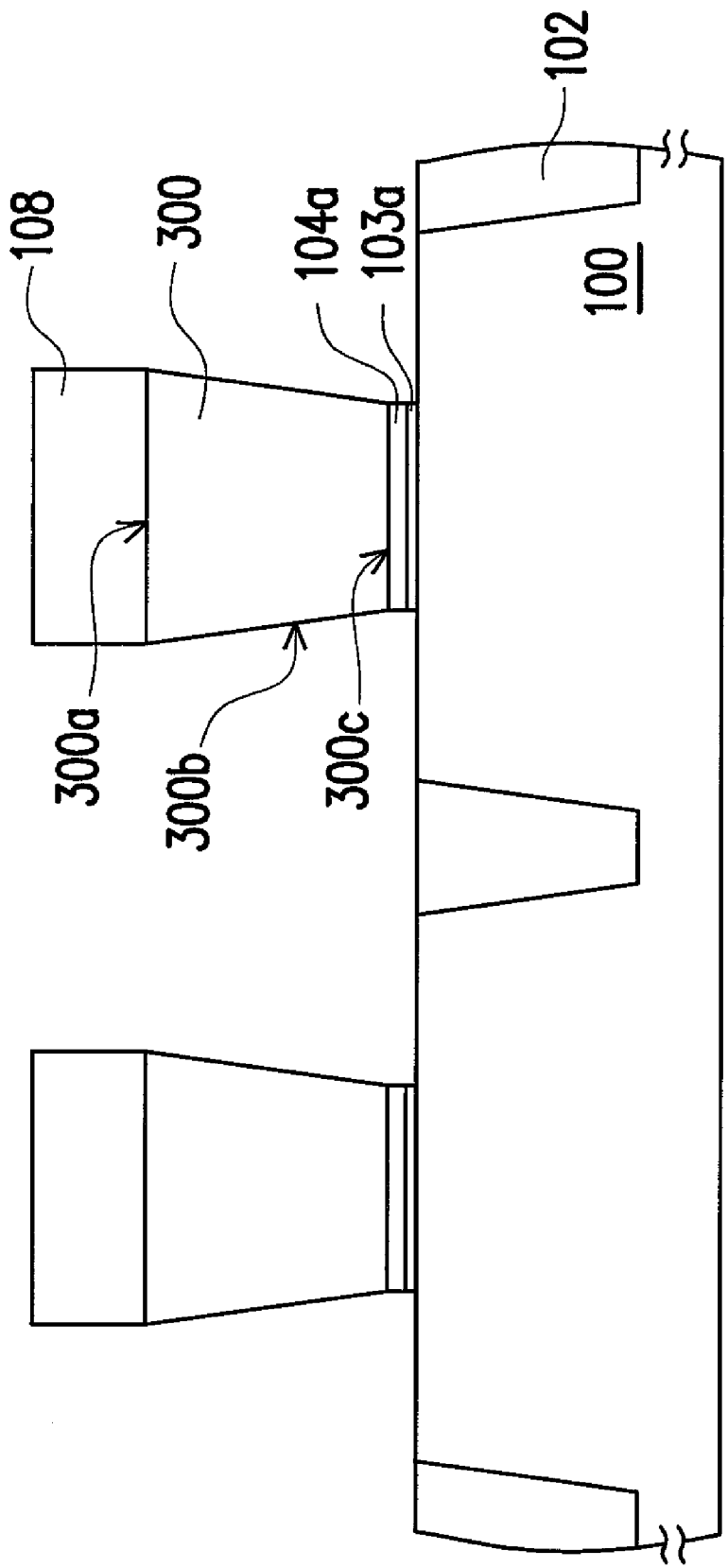

The above-mentioned embodiment is illustrated with the dummy patterns 110 having funnel-like cross-sections. However, the invention is not limited thereto. People of ordinary skills in the art should understand that as long as the width of the neck is narrower than that of the top, the dummy patterns can also be in other shapes. In other words, the concentration distribution of the N-type dopant in the polysilicon layer 106 is adjusted by controlling parameters such as an implantation energy of the ion implantation process 107 and the like. As a result, the location of the horizontal level of height of the highest N-type dopant concentration substantially corresponds to the location of the horizontal level of height of the narrowest width of the dummy patterns formed later. FIG. 2 and FIG. 3 respectively illustrate schematic cross-sectional views of dummy patterns according to another embodiment of the invention. In FIGS. 2 and 3, identical reference numerals are used for the same elements as those in FIG. 1B, and description of those elements is omitted.

In one embodiment, the concentration of the N-type dopant doped in the bottom of the polysilicon layer 106 is made greater than the concentration of the N-type dopant doped in the top thereof by controlling parameters such as the energy for implanting the N-type dopant in the ion implantation process 107 and the like. As illustrated in FIG. 2, after a portion of the polysilicon layer 106 is removed by the etching process, the width of a neck 200b of each dummy pattern 200 is, for instance, narrower than the width of a top 200a. Moreover, the width of the neck 200b substantially equals to the width of a bottom 200c, so as to form a cross-section with a wide top and a narrow bottom.

In one embodiment, the concentration of the doped N-type dopant is increased from the top to the bottom of the polysilicon layer 106 by controlling the parameters such as the energy for implanting the N-type dopant in the ion implantation process 107 and the like. As illustrated in FIG. 3, after a portion of the polysilicon layer 106 is removed by the etching process, the width a neck 300b of each dummy pattern 300 is, for instance, narrower than the width of a top 300a. Moreover, the width of the neck 300b is greater than the width of a bottom 300c, for example, so as to form a trapezoid cross-section reducing gradually from the top to the bottom.

Moreover, in other embodiments of the invention, a plurality of N-type dopants is doped into the polysilicon layer 106, so that the polysilicon layer 106 has the etching rate required at different depths, thereby facilitating the formation of dummy patterns. Obviously, the method of doping the N-type dopant into the polysilicon layer 106 is not limited to the embodiments aforementioned. That is, various methods are acceptable as long as the N-type dopant is doped into the polysilicon material to form dummy patterns having the width of the top greater than that of the neck. People with ordinary skills in the art can make necessary adjustments based on actual demands.

Figure 1C:
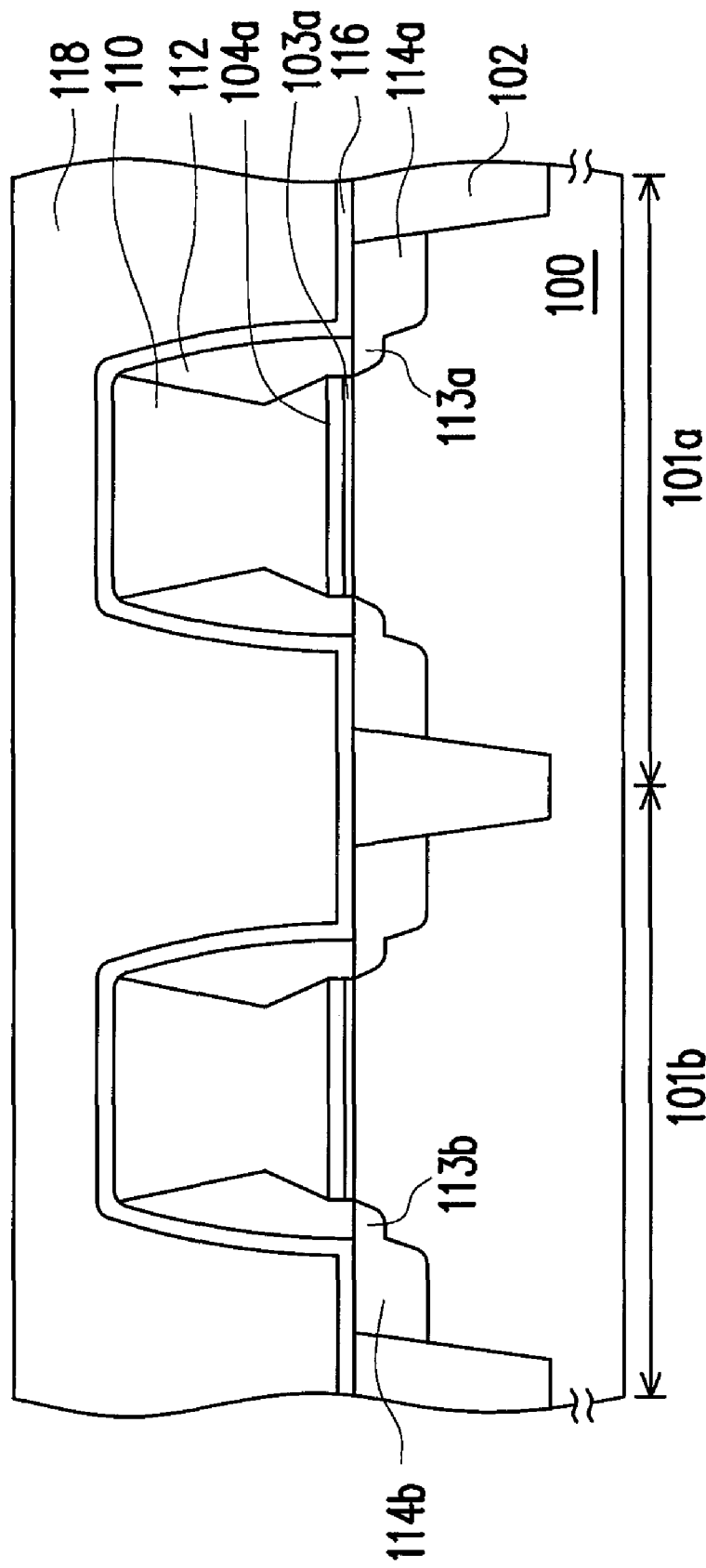

Referring to FIG. 1C simultaneously, the dummy patterns 110 are used as masks for carrying out the ion implantation process so as to form lightly-doped regions 113a in the substrate 100 at respective sides of the dummy pattern 110 within the first region 101a, and to form lightly-doped regions 113b in the substrate 100 at respective sides of the dummy pattern 110 within the second region 101b. The lightly-doped regions 113a and 113b serve as source/drain extension regions of respective MOS transistors to be formed. When the first region 101a is the PMOS region, the lightly-doped regions 113a are P-type lightly-doped regions. When the second region 101b is the NMOS region, the lightly-doped regions 113b are N-type lightly-doped regions. Thereafter, spacers 112 are formed on sidewalls of the dummy patterns 110. The material of the spacers 112 is silicon oxide, silicon nitride, or silicon oxynitride, for example. In a method of forming the spacers 112, for example, a layer of spacer material (not illustrated) is first formed on the substrate 100 by the CVD process, and a portion of the spacer material layer is removed by an anisotropic etching process. In addition, although the spacers 112 are merely illustrated with single-layer structures in FIG. 1C, the spacers 112 can also be multi-layer spacer structures.

Afterwards, source/drain regions 114a are formed in the substrate 100 at the respective sides of the dummy pattern 110 within the first region 101a, and source/drain regions 114b are formed in the substrate 100 at the respective sides of the dummy pattern 110 within the second region 101b. When the first region 101a is the PMOS region, the source/drain regions 114a are P-type heavily-doped regions or SiGe epitaxial layers, for example. When the second region 101b is the NMOS region, the source/drain regions 114b are N-type heavily-doped regions, for instance. In one embodiment, the source/drain regions 114a and 114b are formed by the ion implantation process, for example, so as to form the P-type or the N-type heavily-doped regions respectively in the substrate 100. In another embodiment, in the formation of the source/drain regions 114a, a portion of the substrate 100 at the respective sides of the dummy pattern 110 within the first region 101a is first removed to form trenches (not shown), for example. Subsequently, a selective epitaxy growth (SEG) process is performed to form the SiGe epitaxial layer in each trench. The SiGe epitaxial layer is not only used as the source/region region of the PMOS transistor, but also increases a compressive stress of a channel of the PMOS transistor, so that mobility of holes increases, thereby enhancing operation speed and performance of the PMOS transistor.

After the source/drain regions 114a and 114b are formed, a stop layer 116 is optionally formed on the substrate 100 to cover the first region 101a and the second region 101b entirely. The stop layer 116 is made of silicon nitride, and formed by the CVD process, for example. In one embodiment, the stop layer 116 is utilized as a stress layer providing compressive stress or tensile stress to a channel region. Moreover, the stop layer 116 is capable of generating the tensile stress suitable for the channel of the NMOS transistor or the compressive stress suitable for the channel of the PMOS transistor by changing process parameters in the formation of the stop layer 116. Afterwards, a dielectric layer 118 is formed on the substrate 100 as an interlayer dielectric (ILD) layer. The dielectric layer 118 covers the substrate 100 and the dummy patterns 110 entirely, for instance. The dielectric layer 118, for example, is made of silicon oxide, and can be formed by the CVD process.

Figure 1D:
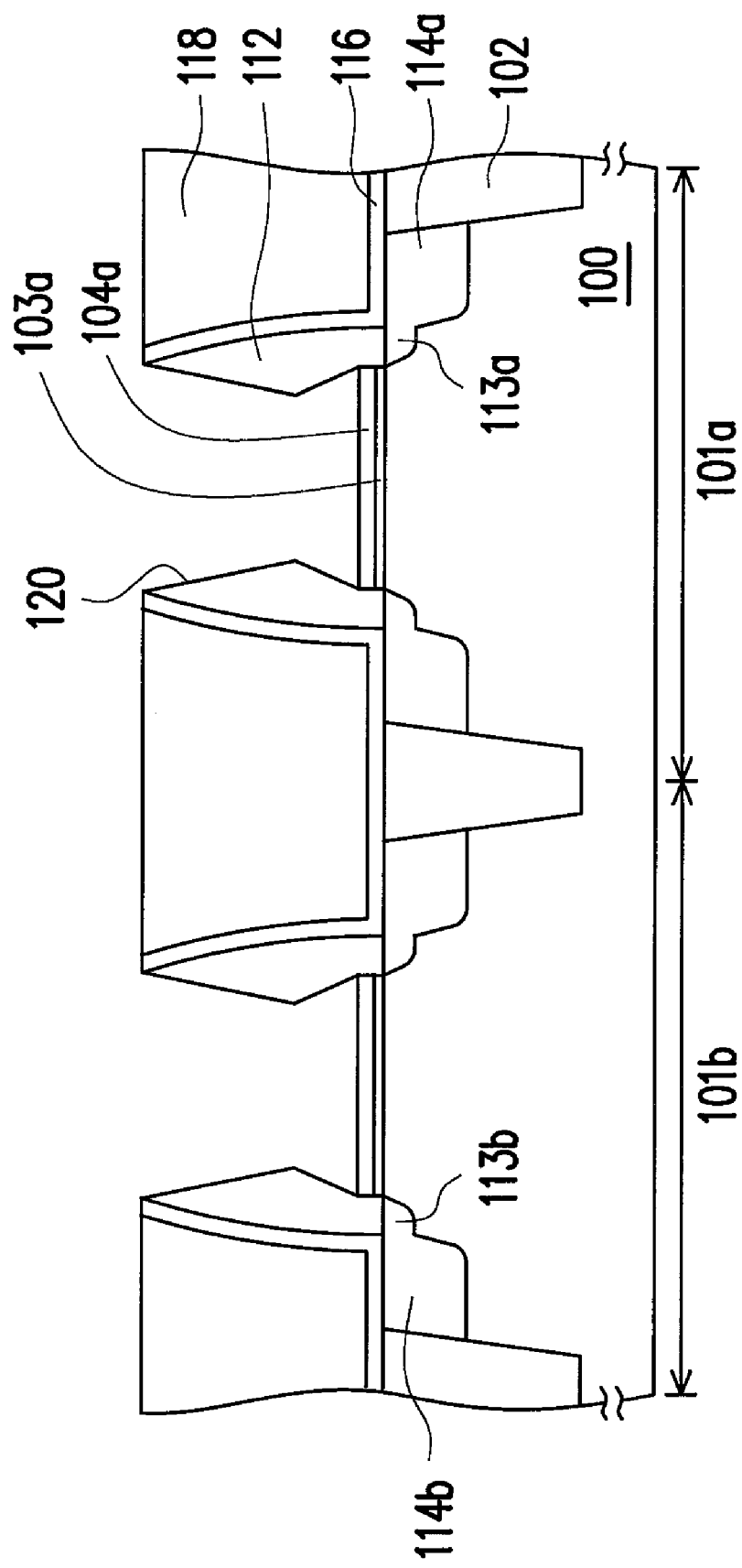

Referring to FIG. 1D, a portion of the dielectric layer 118 and a portion of the stop layer 116 are removed to expose upper surfaces of the dummy patterns 110. A portion of the dielectric layer 118 and a portion of the stop layer 116 are removed by performing a chemical-mechanical polishing (CMP) process or an etching-back process, for example. Thereafter, the dummy patterns 110 are removed to form the trenches 120 and a surface of the high dielectric constant layer 104a is exposed. The dummy patterns 110 are removed, for example, by carrying out a wet etching process, which utilizes KOH solution as an etching solution.

It should be illustrated that the polysilicon doped with the N-type dopant usually has a higher etching rate than the undoped polysilicon. In addition, the etching rate of the polysilicon doped with the N-type dopant is far higher than the etching rate of the polysilicon doped with the P-type dopant. In the previous step, the polysilicon layer is doped with the N-type dopant before the dummy patterns 110 are formed. Therefore, when the dummy patterns 110 are removed by wet etching, a rapid removing rate results and the residual polysilicon material does not remain easily in the trenches 120. Additionally, the doping of the N-type dopant into the polysilicon layer further compensates the P-type dopant implanted in the formation of the lightly-doped regions 113a and 113b or the source-drain regions 114a and 114b. Thus, problems such as troublesome removal of the dummy patterns 110 resulted from P-type dopant overdope are prevented.

Figure 1E:
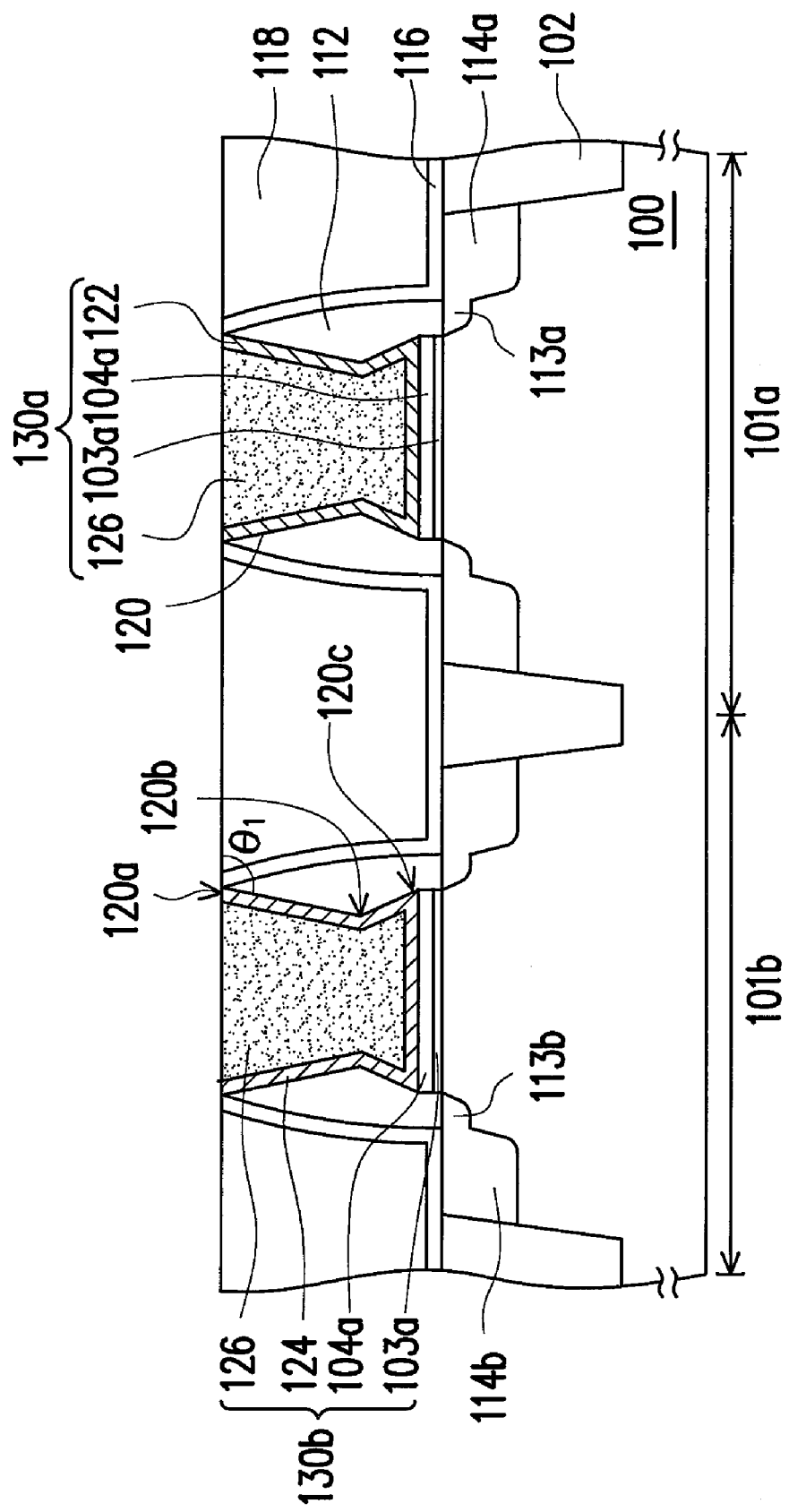

Referring to FIG. 1E, a work function metal layer 122 is formed conformally on the surface of the trench 120 in the first region 101a, and a work function metal layer 124 is formed conformally on the surface of the trench 120 in the second region 101b. The material of the work function metal layers 122 and 124 includes all materials capable of achieving the work function required, such as TiN, TiAl$_x$, TaC, TaCNO, TaCN, or TaN, for instance. The work function metal layers 122 and 124 are formed by the CVD or a physical vapor deposition (PVD) process, for example. The material of the work function metal layer 122 and that of the work function metal layer 124 are different, for instance. In one embodiment, when the first region 101a is the PMOS region, the material of the work function metal layer 122 is TiN, for instance. When the second region 101b is the NMOS region, the material of the work function metal layer 124 is TiAl$_x$, for example. Next, a metal layer 126 is filled into the trenches 120 so as to form gate structures 130a and 130b respectively. The metal layer 126 is made of, for example, Al, aluminum-rich Ti, or a combination thereof, and formed by the CVD process or the PVD process.

Generally, the work function value required by the PMOS transistor is approximately from 5 eV to 5.1 eV, and the work function value required by the NMOS transistor is approximately from 4 eV to 4.1 eV. The work function of the gate structure 130a is determined by the metal layer 126 and the work function metal layer 122 underneath. The work function of the gate structure 130b is determined by the metal layer 126 and the work function metal layer 124 underneath. Therefore, the work function values respectively required by the PMOS transistor and the NMOS transistor can be achieved by adjusting the material and the thickness of the work function metal layers 122 and 124.

It should be illustrated that since the width of the neck is narrower than that of the top of each dummy pattern, the trench 120 formed after the removal of each dummy pattern is shaped into a structure having a wide opening in the top portion. That is, an included angle $\theta_1$ between the sidewall of the top 120a of the trench 120 and the surface of the dielectric layer 118 is larger than 90°, for instance. Hence, the trenches 120 each having a wide opening in the top portion not only facilitate the rapid removal of the dummy patterns, but also have superior metal gap fill effect when forming the metal layer 126 so that voids are not formed easily.

FIG. 1E is used as an exemplary example in the following to further illustrate the structure of the semiconductor device of the invention.

Referring to FIG. 1E, the semiconductor device of the present embodiment includes the substrate 100, the gate structures 130a and 130b, and the source/drain regions 114a and 114b. The substrate 100 includes the first region 101a and the second region 101b spaced by the isolation structures 102. When the first region 101a, for instance, is the PMOS region, the second region 101b is the NMOS region. The dielectric layer 118 is disposed on the substrate 100, and the trenches 120 are disposed in the dielectric layer 118. Each trench 120 includes a top 120a, a neck 120b, and a bottom 120c. The neck 120b is arranged between the top 120a and the bottom 120c.

The gate structure 130a, for example, is disposed within the first region 101a, and includes the insulation layer 103a, the high dielectric constant layer 104a, the work function metal layer 122, and the metal layer 126 disposed sequentially on the substrate 100. The high dielectric constant layer 104a and the insulation layer 103a are adopted jointly as a gate dielectric layer of the gate structure 130a, for example. The work function of the gate structure 130a is determined by the metal layer 126 and the work function metal layer 122 underneath, for example. The source/drain regions 114a are disposed in the substrate 100 at respective sides of the gate structure 130a. In one embodiment, the lightly-doped regions 113a are disposed in the substrate 100 between the gate structure 130a and the source/drain regions 114a.

The gate structure 130b, for example, is disposed within the second region 101b, and includes the insulation layer 103a, the high dielectric constant layer 104a, the work function metal layer 124, and the metal layer 126 disposed sequentially on the substrate 100. The high dielectric constant layer 104a and the insulation layer 103a are adopted jointly as a gate dielectric layer of the gate structure 130b. The work function of the gate structure 130b is determined by the metal layer 126 and the work function metal layer 124 underneath, for example. The source/drain regions 114b are disposed in the substrate 100 at the respective sides of the gate structure 130b. In one embodiment, the lightly-doped regions 113b are disposed in the substrate 100 between the gate structure 130b and the source/drain regions 114b.

As aforementioned, the gate structures 130a and 130b are disposed in the trenches 120, for example. The insulation layer 103a is disposed on the surface of the substrate 100 in the trenches 120. The high dielectric constant layer 104a is disposed on the surface of the insulation layer 103a. The work function metal layer 122 and the work function metal layer 124 are conformally disposed on the surfaces of the trenches 120 in the first region 101a and the second region 101b, and cover the high dielectric constant layer 104a, respectively. The metal layer 126 fills the trenches 120 and covers the work function metal layers 122 and 124.

It should be noted that each trench 120 is a structure having a wide opening in the top portion, for example. That is, an included angle $\theta_1$ between the sidewall of the top 120a of each trench 120 and the surface of the dielectric layer 118 is larger than 90°, for example. The width of the neck 120b of each trench 120 is narrower than that of the top 120a, and the width of the neck 120b is narrower than that of the bottom 120c, for example. Therefore, cross-sections with a funnel-like shape are formed. In one embodiment, the ratio of the height from the neck 120b to the top 120a and the height from the neck 120b to the bottom 120c is substantially 2:1. In other words, when the depth of the trenches 120 is about 500 Å to 600 Å, the difference in height between the neck 120b and the top 120a of each trench 120, for example, is about 300 Å to 400 Å.

Figure 4:
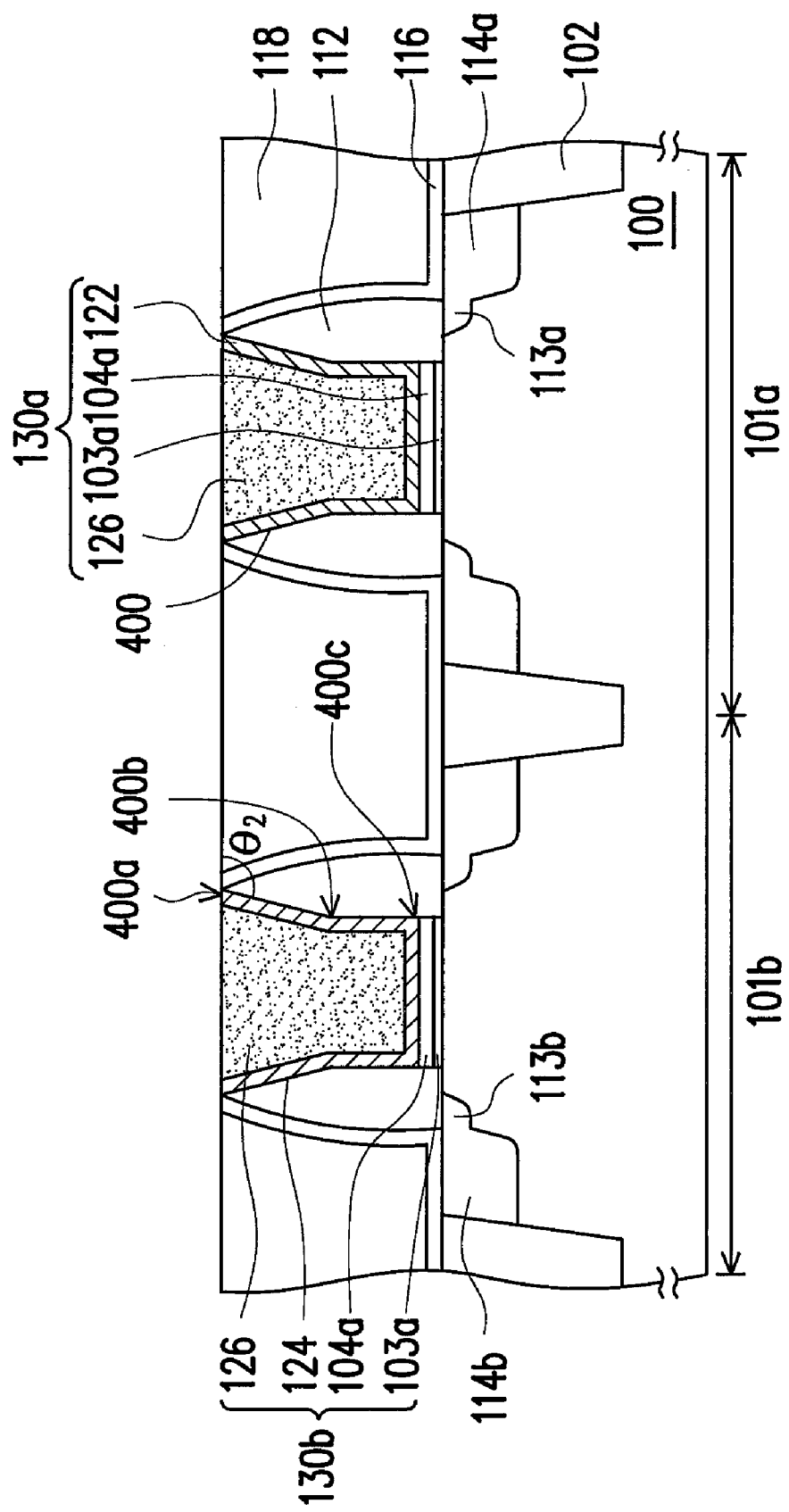
FIG. 4 is a cross-sectional view schematically illustrating a semiconductor device according to another embodiment of the invention.

In addition, the gate structures in the semiconductor device of the invention not only form the funnel-like trenches aforementioned, but can also form trenches of other shapes. FIG. 4 is a cross-sectional view schematically illustrating a semiconductor device according to another embodiment of the invention. In FIG. 4, identical reference numerals are used for the same elements as those in FIG. 1E, and description of those elements is omitted.

Referring to FIG. 4, in another embodiment, the main components constituting the semiconductor device illustrated in FIG. 4 are generally identical to those constituting the semiconductor device illustrated in FIG. 1E. However, the difference between the two semiconductor devices mainly regards to the forms of the trenches. The gate structures 130a and 130b are disposed in the trenches 400, for example. Each trench 400 is a structure having a wide opening in the top portion, and an included angle $\theta_2$ between a sidewall of a top 400a thereof and the surface of the dielectric layer 118 is larger than 90°, for instance. The width of a neck 400b of each trench 400 is narrower than the width of the top 400a, for example. Furthermore, the width of the neck 400b of each trench 400 substantially equals to the width of a bottom 400c, so as to form a cross-section having a wide top and a narrow bottom.

In light of the foregoing, the semiconductor device and the method of fabricating the same in the embodiments aforementioned have at least the following advantages:

1. The gate structures of the semiconductor device in the embodiments above-mentioned are disposed in the trenches each having the width of the neck narrower than that of the top. Therefore, the metal layers filled in the trenches do not have voids, and thereby have superior device performance.

2. Each trench of the semiconductor device in the embodiments above-mentioned has the design of the width of the neck narrower or equal to that of the bottom, so that trench having a wide opening can be formed without reducing the width of the bottom. Consequently, the critical dimension (CD) of the device is not affected.

3. In the method of fabricating the semiconductor device in the embodiments above-mentioned, before the dummy patterns are formed, the N-type dopant is doped into the polysilicon layer to enhance the etching rate of the polysilicon layer regionally. As a result, the dummy patterns each having the width of the neck narrower than that of the top are formed so as to enhance the metal gap fill ability, so that voids do not form easily.

4. In the method of fabricating the semiconductor device in the embodiments above-mentioned, the doping of the N-type dopant into the polysilicon layer further compensates the P-type dopant implanted in the process, so that the dummy patterns can be removed rapidly without leaving residual polysilicon material in the trenches.

5. The method of fabricating the semiconductor device in the embodiments aforementioned can be applied in all gate last processes, especially in the gate last process for forming metal gates, and can be integrated with the existing semiconductor process. The process aforementioned is not only simple, but can also improve the reliability of the device effectively.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor device, comprising:
   a substrate, disposed with a dielectric layer thereon, wherein a trench is disposed in the dielectric layer;
   a gate structure, located in the trench and comprising a high dielectric constant layer, a work function metal layer, and a metal layer sequentially disposed on the substrate; and
   a source/drain region, disposed in the substrate at respective sides of the gate structure,
   wherein the trench comprises a top, a bottom, and a neck arranged between the top and the bottom, a width of the neck is narrower than a width of the top, and the width of the neck is narrower than or equal to a width of the bottom.

2. The semiconductor device as claimed in claim 1, wherein the top and the neck have a first height therebetween, the neck and the bottom have a second height therebetween, and a ratio of the first height to the second height is substantially 2:1.

3. The semiconductor device as claimed in claim 1, wherein an included angle between a sidewall of the top of each of the plurality of trenches and a surface of the dielectric layer is larger than 90°.

4. The semiconductor device as claimed in claim 1, further comprising an insulation layer disposed between the substrate and the high dielectric constant layer.

5. The semiconductor device as claimed in claim 1, wherein the source/drain region is a doped region or an epitaxial layer.

6. The semiconductor device as claimed in claim 1, further comprising a spacer disposed on a sidewall of the gate structure.

* * * * *